US006689667B2

(12) United States Patent
Nam et al.

(10) Patent No.: US 6,689,667 B2
(45) Date of Patent: Feb. 10, 2004

(54) PHOTORECEIVER OF SELECTIVELY DETECTING LIGHT OF A SPECIFIC WAVELENGTH AND THE METHOD OF MANUFACTURING THE SAME

(75) Inventors: Eun soo Nam, Daejon-Shi (KR); Heacheon Kim, Daejon-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 0 days.

(21) Appl. No.: 10/209,252

(22) Filed: Jul. 30, 2002

(65) Prior Publication Data

US 2003/0222265 A1 Dec. 4, 2003

(30) Foreign Application Priority Data

May 31, 2002 (KR) .......................... 2002-30541

(51) Int. Cl.[7] .......................................... H01L 21/8222
(52) U.S. Cl. ....................................... 438/328; 438/309
(58) Field of Search ................................ 438/328, 309

(56) References Cited

U.S. PATENT DOCUMENTS 4,884,119 A    11/1989    Miller

Primary Examiner—John F. Niebling
Assistant Examiner—Christopher Lattin
(74) Attorney, Agent, or Firm—Blakely, Sokoloff, Taylor & Zafman

(57) ABSTRACT

The present invention relates to a photoreceiver and method of manufacturing the same. For the purpose of a selective detection of a specific wavelength, if a waveguide type photodetector using a multiple quantum-well layer having a quantum confined stark effect as an optical absorption layer, the wavelength that is absorbed by the stark effect by which the transition energy edge of the optical absorption band is varied depending on the intensity of an electric field applied to the multiple quantum-well layer is varied. Thus, a wavelength selective detection characteristic can be varied simply implemented. The waveguide type photodetector of this structure is integrated on a semi-insulating InP substrate with a heterogeneous bipolar transistor having an n+InP/p+InGaAs/n−InGaAs/n+InGaAsP high-gain amplification characteristic. Thus, a photoreceiver of a high performance and a high sensitivity having a specific wavelength selective detection function that can be used in an optical communication system of a high-performance wavelength-multiplexing mode can be provided.

5 Claims, 2 Drawing Sheets

PHOTORECEIVER OF SELECTIVELY DETECTING LIGHT OF A SPECIFIC WAVELENGTH AND THE METHOD OF MANUFACTURING THE SAME

BACKGROUND OF THE INVENTION

1. Field of the Invention

The invention relates generally to a photoreceiver for detecting and amplifying optical signal in an optical communication system of an ultra-high large-scale wavelength division multiplexing mode, and method of manufacturing the same. More particularly, the invention relates to a photoreceiver in which a photodetector using a quantum-well structure having a quantum confined stark effect as an optical absorption layer and a heterojunction bipolar transistor are integrated on a single chip, whereby an optical signal of a specific wavelength is selectively detected and a converted electrical signal is amplified, thus providing a good amplification characteristic and receiver sensitivity, and method of manufacturing the same.

2. Description of the Prior Art

A conventional photoreceiver, which has been widely used in optical communication systems, has a structure in which a p+InGaAs/i–InGaAs/n+InGaAs long wavelength photodetector 10 of a common PiN structure and a heterojunction bipolar transistor 20 of a n+InP/p+InGaAs/i-InGaAs/n+InGaAs structure are integrated on a semi-insulating InP substrate 101, as shown in FIG. 1.

In other words, the long wavelength photodetector 10 has an n+InGaAs layer 102A, an n–InGaAs optical absorption layer 103A and a p+InGaAs ohmic layer 104A, all of which are stacked on given regions of the semi-insulating InP substrate 101. At this time, the n–InGaAs optical absorption layer 103A and the p+InGaAs ohmic layer 104A are formed on a given region of the n+InGaAs layer 102A. A p-electrode 105 is formed on a given region of the p+InGaAs ohmic layer 104A and a n-electrode 106 is also formed on a given region of the n+InGaAs layer 102A.

Also, a heterojunction bipolar transistor 20 has a n+InGaAs sub-collector 102B, a n–InGaAs collector 103B, a p+InGaAs base 104B, an n+InP emitter 108 and a n+InGaAs ohmic layer 108, all of which are stacked. The n–InGaAs collector 103B and the p+InGaAs base 104B are formed on a given region over the n+InGaAs sub-collector 102B. An n+InP emitter 107 and an n+InGaAs ohmic layer 108 are also formed on a given region over the p+InGaAs base 104B. An emitter electrode 109 is formed on the n+InGaAs ohmic layer 108. A base electrode 110 is formed on a given region over the p+InGaAs base 104B. A collector electrode 111 is formed on a given region over the n+InGaAs sub-collector 102B.

Meanwhile, polymer 112 for protecting the surface of the long wavelength photodetector 10 and the heterojunction bipolar transistor 20 and electrically connecting them is formed on the entire structure. The long wavelength photodetector 10 and the heterojunction bipolar transistor 20 are then patterned to expose respective electrodes, thus forming an air bridge metal line between the p-electrode 105 of the photodetector 10 and the base electrode 110 of the heterojunction bipolar transistor 20.

The crystal structure of the $p^+$-InGaAs/i-InGaAs/$n^+$-InGaAs long wavelength photodetector of a simple PiN crystal structure thus constructed, has been widely employed since additional crystal growth for integrated photodetectors are unnecessary because it is same with the base, collector and the sub-collector of the heterojunction bipolar transistor.

The photoreceiver of this structure has only a simple function of detecting and amplifying optical signals but does not have a characteristic of selectively detecting optical signals considering wavelength. Further, there is another problem in the conventional structure. That is, as the layer for absorbing light is the surface incident type, the cross section of an optical fiber is wide and covers all the area of an integrated chip if the structure is made module by using this optical fiber coupling scheme, thus having difficulty in making a module of the structure.

Various wavelengths are multiplexed in a current large-scale wavelength division multiplexing optical communication system. Thus, an optical grating router, an arrangement waveguide diffraction grating, and the like in the receiving element again demultiplexing multiplexed signals. A photodetector then converts the demultiplexed optical signals into electrical signals. Next, an amplifier amplifies the electrical signals. As such, the construction of the receiving elements for demultiplexing, detecting and amplifying the optical signals becomes complex. Therefore, there is a disadvantage that the manufacturing cost is high. Therefore, in order to construct an cost effective optical communication system of a ultra-high long distance large-scale wavelength division-multiplexing mode, there is a need for a photoreceiver for selectively detecting the optical signals of a specific wavelength from various multiplexed wavelengths and having a high gain amplification function of converted electrical signals.

SUMMARY OF THE INVENTION

The present invention is contributed to solve the above problems and an object of the present invention is to provide a single chip integrated photoreceiver capable of selectively detecting optical signals of a specific wavelength from various wavelengths and having a function of amplifying converted electrical signals, and method of manufacturing the same.

Another object of the present invention is to provide a single chip integrated photoreceiver in which a waveguide type photodetector using a quantum-well structure having a quantum confined stark effect as an optical absorption layer and a n+InP/p+InGaAs/n–InGaAs/n+InGaAsP heterojunction bipolar transistor for amplifying electrical signals converted by the waveguide type photodetector are integrated on semi-insulating InP substrate, and method of manufacturing the same.

According to the present invention, in order to selectively detect optical signals of a specific wavelength, a waveguide type photodetector using a multiple quantum-well layer having a quantum confined stark effect as an optical absorption layer. As shown in FIG. 2, the wavelength of light that is absorbed by the quantum confined Stark effect the transition energy of which at the optical absorption band is varied depending on the intensity of an electric field applied to the multiple quantum-well layer, as shown in FIG. 2. Therefore, a wavelength selective detection characteristic can be very simply implemented. Further, the waveguide type photodetector of this type is integrated on a single semi-insulating InP substrate with a heterojunction bipolar transistor having an n+InP/p+InGaAs/n–InGaAs/n+InGaAsP high gain amplification characteristic. Therefore, a photoreceiver of a cost effective and high performance having a function of selectively detecting a specific wavelength, which can be used in an optical communication system of a high-performance wavelength division-multiplexing mode, is provided.

In order to accomplish the above object, a photoreceiver according to the present invention, is characterized in that it comprises a waveguide type photodetector consisting of a p+InGaAsP ohmic electrode formed on a given region of a semi-insulating InP substrate, an i-InGaAsP($\lambda_1$)/i-InGaAsP ($\lambda_2$) optical absorption layer of a multiple quantum-well structure which are stacked on a given region of the p+InGaAsP ohmic electrode, a n+InGaAsP, an n-InGaAs ohmic layer, and a n-electrode and a p-electrode each of which is formed on a given regions of the n-InGaAs layer and a given region of the p+InGaAsP ohmic electrode; and a heterojunction bipolar transistor consisting of a p+InGaAsP layer stacked on a given region of the semi-insulating InP substrate, i-InGaAsP($\lambda_1$)/i-InGaAsP($\lambda_2$) layer and n+InGaAsP sub-collector layer of a multiple quantum-well structure, n-InGaAs layer and p+InGaAs base layer for high-speed current transfer that are stacked on given regions of the n+InGaAsP sub-collector layer, n+InP emitter layer and n+InGaAs ohmic layer which are stacked on given regions of the p+InGaAs base layer, an emitter electrode formed on the n+InGaAs ohmic layer, a base electrode formed on a given region of the p+InGaAs base layer, and a collector electrode formed on a given region of the n+InGaAsP sub-collector layer.

Further, a method of manufacturing a photoreceiver according to the present invention, is characterized in that it comprises the steps of sequentially forming a p+InGaAsP layer, an i-InGaAsP/i-InGaAsP layer of a quantum-well structure, an n+InGaAsP layer, an n-InGaAs layer, a p+InGaAs layer, an n+InP layer and an n+InGaAs layer on a semi-insulating InP substrate; defining a photodetector region and a heterojunction bipolar transistor and then removing the n+InGaAs layer, the n+InP layer and the p+InGaAs layer in the photodetector region; etching out the given region of n-InGaAs layer, n+InGaAsP layer and the i-InGaAsP($\lambda_1$)/i-InGaAsP($\lambda_2$) layer of a quantum-well structure in the photodetector region to expose the p+InGaAsP layer, thus defining a waveguide type photodetector; forming a n-electrode on a given region of the n-InGaAs layer and then forming a p-electrode on a given region of the p+InGaAsP layer to produce a waveguide type photodetector; isolating the photodetector region and the heterojunction bipolar transistor region by etching to a given region of the p+InGaAs layer from the n+InGaAs layer to expose a given region of the semi-insulating InP substrate; selectively etching the n+InGaAs layer and the n+InP layer in the heterojunction bipolar transistor region to form an emitter electrode of a mesa shape; forming a base electrode on a given region of the exposed p+InGaAs layer; and removing the n-InGaAs layer and then forming a collector electrode on a given region of the exposed n+InGaAsP layer, thus producing a heterogeneous bipolar transistor.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1:
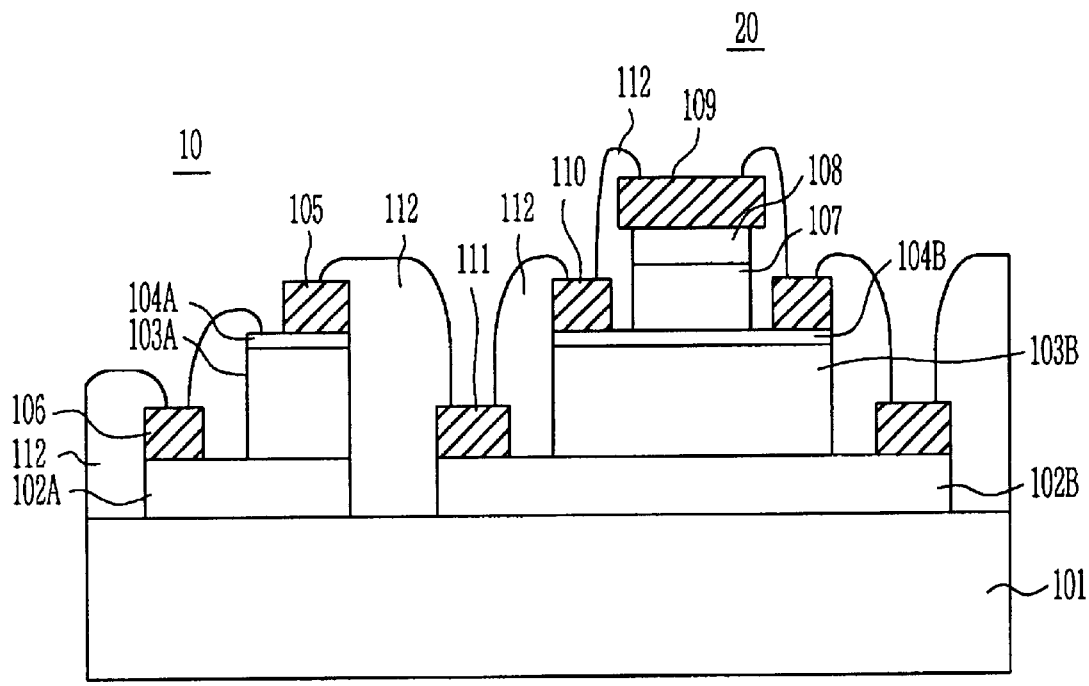
FIG. 1 is a cross-sectional view of a photoreceiver in which a planar type long wavelength photodetector of a common PiN structure and an n+InP/p+InGaAs/n-InGaAs/n+InGaAsP heterogeneous bipolar transistor are integrated.
Figure 2:
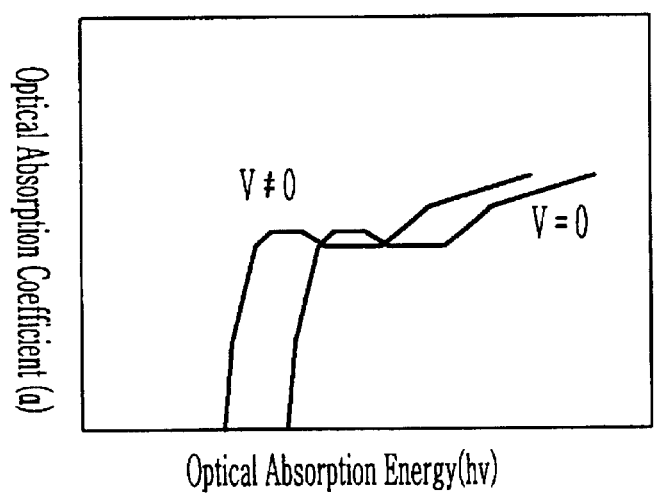
FIG. 2 is a graph showing variation in the transition edge energy of a light absorption wavelength depending on the intensity of the applied electric field to multiple quantum-well structure.
Figure 3:
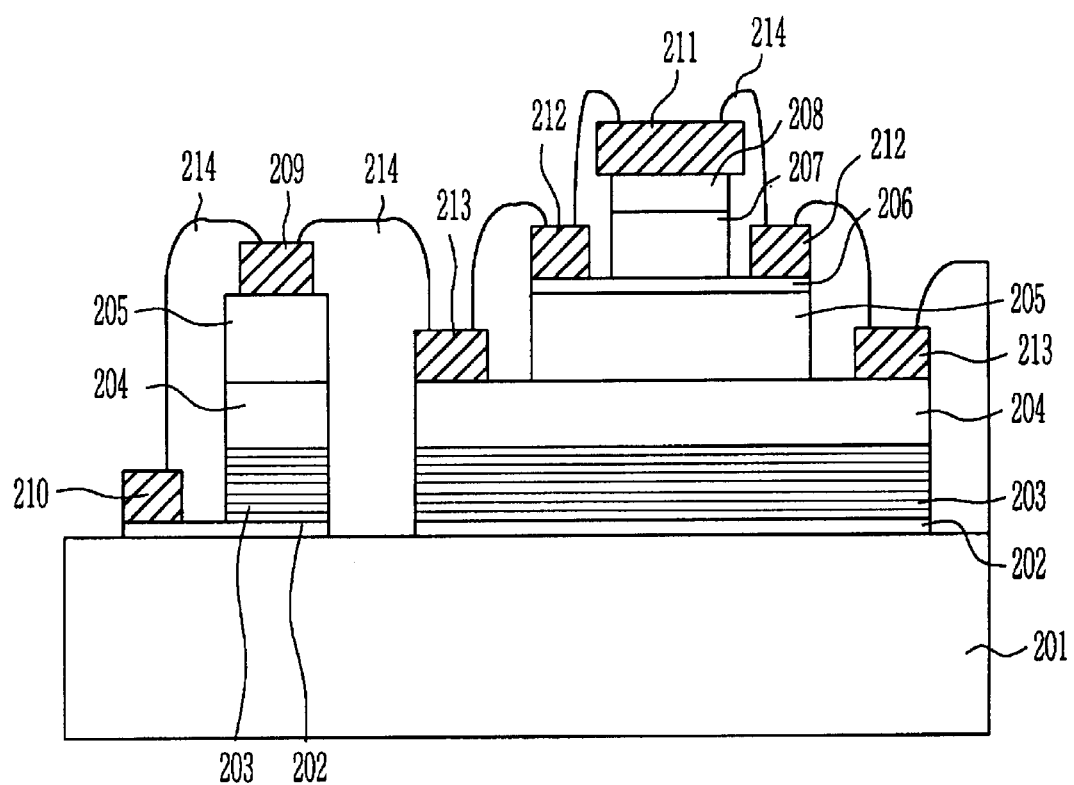
FIG. 3 a cross-sectional view of a photoreceiver in which a waveguide type long wavelength photodetector using a multiple quantum-well layer as a light absorption layer and an n+InP/p+InGaAs/n-InGaAs/n+InGaAsP heterogeneous bipolar transistor are integrated according to the present invention.

FIG. 3 a cross-sectional view of a photoreceiver in which a waveguide type long wavelength photodetector using a multiple quantum-well layer as a light absorption layer and an n+InP/p+InGaAs/n-InGaAs/n+InGaAsP heterogeneous bipolar transistor are integrated according to the present invention.

The photoreceiver includes a p+InGaAsP layer 202 for forming a photodetector ohmic electrode, an i-InGaAsP ($\lambda 1$)/i-InGaAsP($\lambda_2$) multiple quantum well layer 203 as an optical absorption layer of a multiple quantum-well structure having a wavelength selective detection characteristic depending on the intensity of an electric field that is applied to a quantum confined Stark effect, an n+InGaAsP layer 204 for a sub-collector layer of a heterojunction bipolar transistor, an n-InGaAs layer 205 for a high-speed current transfer of the heterogeneous bipolar transistor, a p+InGaAs layer 206 for a base layer, an n+InP layer 207 for an emitter layer, and an n+InGaAs layer 208 for improving an ohmic characteristic of the transistor, all of which are sequentially stacked on a semi-insulating InP substrate 201 by means of a MOCVD method being an organic metal vapor growth method.

Next, a photodetector region A and a heterojunction bipolar transistor region B are defined. An etching mask as an insulating film by which the heterojunction bipolar transistor region B is closed and the photodetector region A is exposed is then formed. Next, the n+InGaAs layer 208, the n+InP layer 207 and the p+InGaAs layer 206, which are formed in the photodetector region A, are completely removed. The n-InGaAs layer 205 in the photodetector region A, the n+InGaAsP layer 206 and, a given region in a longitudinal direction of the i-InGaAsP/i-InGaAsP layer 203 are then removed to form a waveguide photodiode by means of photolithography process and etching process, so that the p+InGaAsP layer 202 is exposed. Thus, the photodetector region A is formed to be a waveguide type. Ti/Pt/Au is then deposited on a given region by photolithography process and lift-off process to form an n-electrode 209. Ti/Pt/Au is also deposited on a given region by photolithography process and lift-off process to form a p-electrode 210. Next, an annealing process is performed to complete the photodetector.

In order to isolate the photodetector and the heterogeneous bipolar transistor, a given region of the p+InGaAsP layer 202 is removed from the top n+InGaAs layer 208 to expose a given region of the semi-insulating InP substrate 201.

An etching mask as an insulating film by which the photodetector region A is closed and the heterogeneous bipolar transistor region B is exposed is formed. The n+InGaAs layer 208 and the n+InP layer 207 are selectively etched to form an emitter electrode 211 of a mesa shape.

Ti/Pt/Au is then deposited on the exposed n+InGaAs layer 208 by the photolithography process and lift-off process to form a emitter electrode 211. Ti/Pt/Au is then deposited on the exposed p+InGaAs layer 206 by the photolithography process and liftoff process to form a base electrode 212. The n–InGaAs layer 205 is removed. Next, Ti/Pt/Au is also deposited on the exposed n+InGaAsP layer 204 by the photolithography process and lift-off process to form a collector electrode 213.

Thereafter, in order to protect the surface of the photodetector and the heterojunction bipolar transistor and electrically connect them, polymer 214 is coated. Each of the electrodes is exposed by means of the photolithography process and etching process. Due to this, an air bridge metal line is formed between the p-electrode 210 of the photodetector and the base electrode 212 of the heterojunction bipolar transistor. Thus, a single chip integration type photoreceiver for selectively detecting light of a specific wavelength, in which a waveguide type photodetector and a n+InP/p+InGaAs/n–InGaAs/n+InGaAsP heterogeneous bipolar transistor are integrated, is completed.

As mentioned above, according to the present invention, a waveguide type photodetector using a quantum-well structure as an optical absorption layer and n+InP/p+InGaAs/n–InGaAs/n+InGaAsP heterojunction bipolar transistor for amplifying an electrical signal converted by the waveguide type photodetector is integrated on a semi-insulating InP substrate. Thus, a single chip integrated photoreceiver having a function of selectively detecting wavelengths and good receiver sensitivity and amplification characteristics can be implemented. Further, as the structure of the photodetector is formed to be a waveguide type, there is an advantage that an optical fiber and the photodetector are easily coupled because the optical fiber is arranged to the edge of the photodiode. If the waveguide type photodetector of this structure having a quantum confined Stark effect and the heterojunction bipolar transistor are integrated on a single chip, the photodetector and the heterogeneous bipolar transistor are grown in a vertical direction. Thus, they can be manufactured by a single run of organic metal vapor growth method. Therefore, there is an advantage that the process can be simplified compared to a process of manufacturing a single chip of a high-speed electronic device having a structure the crystal growth of which is needed to be by several times.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a photoreceiver, comprising the steps of:

sequentially forming a p+InGaAsP layer, an i–InGaAsP/i–InGaAsP layer of a quantum-well structure, an n+InGaAsP layer, an n–InGaAs layer, a p+InGaAs layer, an n+InP layer and an n+InGaAs layer, on a semi-insulating InP substrate;

defining a photodetector region and a heterojunction bipolar transistor and then removing the n+InGaAs layer, the n+InP layer and the p+InGaAs layer in the photodetector region;

removing the n–InGaAs layer, n+InGaAsP layer and a given region of the i–InGaAsP/i–InGaAsP layer of a quantum-well structure in the photodetector region to expose the p+InGaAsP layer, thus defining a waveguide type photodetector;

forming an n-electrode on a given region of the n–InGaAs layer and then forming a p-electrode on a given region of the p+InGaAsP layer to produce a waveguide type photodetector;

isolating the photodetector region and the heterogeneous bipolar transistor region, by removing a given region of the p+InGaAs layer from the n+InGaAs layer to expose a given region of the semi-insulating InP substrate;

selectively etching the n+InGaAs layer and the n+InP layer in the heterogeneous bipolar transistor region to form an emitter electrode on a mesa shape;

forming a base electrode on a given region of the exposed p+InGaAs layer; and selectively removing the n–InGaAs layer and then forming a collector electrode on a given region of the exposed n+InGaAsP layer, thus producing a heterojunction bipolar transistor.

2. The method as claimed in claim 1, wherein the p+InGaAsP layer, the i–InGaAsP/i–InGaAsP layer of the multiple quantum-well structure, the n+InGaAsP layer, the n–InGaAs layer, the p+InGaAs layer, the n+InP layer and the n+InGaAs layer are formed by an organic metal vapor growth method.

3. The method as claimed in claim 1, wherein the p-electrode and the n-electrode are formed by depositing Ti/Pt/Au by photolithography process and lift-off process.

4. The method as claimed in claim 1, wherein the base electrode and the collector electrode are formed by depositing Ti/Pt/Au by photolithography process and lift-off process.

5. The method as claimed in claim 1, further including the step of forming polymer on the entire structure in order to protect the surface of the waveguide photodetector and the heterogeneous bipolar transistor and electrically connecting the waveguide photodetector and the heterojunction bipolar transistor, exposing the electrode and then forming an air bridge metal line between the p-electrode and the base electrode.

* * * * *